United States Patent
Yadav et al.

(10) Patent No.: US 11,675,528 B2
(45) Date of Patent: Jun. 13, 2023

(54) SWITCH BASED BGA EXTENSION

(71) Applicant: WESTERN DIGITAL TECHNOLOGIES, INC., San Jose, CA (US)

(72) Inventors: Akhilesh Yadav, Karnataka (IN); Ramanathan Muthiah, Karnataka (IN); Eldhose Peter, Karnataka (IN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 64 days.

(21) Appl. No.: 17/216,046

(22) Filed: Mar. 29, 2021

(65) Prior Publication Data

US 2022/0308787 A1     Sep. 29, 2022

(51) Int. Cl.
  *G06F 3/06* (2006.01)

(52) U.S. Cl.
  CPC .......... *G06F 3/0655* (2013.01); *G06F 3/0604* (2013.01); *G06F 3/0634* (2013.01); *G06F 3/0635* (2013.01); *G06F 3/0679* (2013.01)

(58) Field of Classification Search
  CPC ..... G06F 3/0634; G06F 3/0635; G06F 3/0679
  See application file for complete search history.

(56) References Cited

U.S. PATENT DOCUMENTS

| | | | |
|---|---|---|---|
| 8,055,959 B2 | 11/2011 | Cornwell et al. | |
| 8,341,332 B2 | 12/2012 | Ma et al. | |
| 9,524,254 B2 | 12/2016 | Jeddeloh et al. | |
| 10,108,567 B2 | 10/2018 | Liu | |
| 2008/0140972 A1* | 6/2008 | Kim | G06F 12/1466 711/164 |
| 2015/0350322 A1* | 12/2015 | Akaike | G06F 3/067 707/827 |
| 2016/0034527 A1* | 2/2016 | Barber | G06F 16/24554 707/693 |
| 2016/0216911 A1* | 7/2016 | Ford | G06F 3/067 |
| 2017/0249167 A1* | 8/2017 | Izumi | G06F 3/0685 |
| 2019/0073298 A1* | 3/2019 | Wang | G06F 12/0246 |
| 2020/0034307 A1* | 1/2020 | Duzly | G06F 12/0246 |
| 2020/0065000 A1 | 2/2020 | Nagadomi | |
| 2020/0142849 A1* | 5/2020 | Law | G06F 13/40 |
| 2020/0272567 A1* | 8/2020 | Gans | G06F 12/0862 |

\* cited by examiner

*Primary Examiner* — David Yi
*Assistant Examiner* — Nicholas A. Paperno
(74) *Attorney, Agent, or Firm* — ArentFox Schiff LLP (57) ABSTRACT

Aspects of a storage device including a memory and a controller are provided. The memory includes a plurality of non-volatile memory packages coupled to the switch, in which each non-volatile memory package includes a plurality of non-volatile memory dies. The controller can select a non-volatile memory package with the switch. The controller can establish a data channel connection between the selected non-volatile memory package and the controller via the switch. In some aspects, the selected non-volatile memory package is transitioned into an active mode and one or more non-selected non-volatile memory packages are each transitioned into a standby mode. The controller also can perform one or more storage device operations with one or more non-volatile memory dies of the plurality of non-volatile memory dies within the selected non-volatile memory package. Thus, the controller may facilitate a switch based ball grid array extension, thereby improving memory capacity of the storage device.

20 Claims, 8 Drawing Sheets

Select A Non-volatile Memory Package Of The Plurality Of Non-volatile Memory Packages With The Switch

704

Identify The Non-volatile Memory Package For Selection Based On A Logical Block Address Mapping From One Or More Flash Translation Layer Control Tables At A Flash Translation Layer Module Of The Controller

706

Drive A First Current To The Selected Non-volatile Memory Package And A Second Current To Each Of The One Or More Non-selected Non-volatile Memory Packages Via The Switch, The Second Current Being Smaller Than The First Current

708

Establish A Data Channel Connection Between The Selected Non-volatile Memory Package And The Controller Via The Switch

710

Perform One Or More Storage Device Operations With One Or More Non-volatile Memory Dies Of The Plurality Of Non-volatile Memory Dies Within The Selected Non-volatile Memory Package

SWITCH BASED BGA EXTENSION

BACKGROUND

Field

This disclosure is generally related to electronic devices and more particularly to storage devices.

Introduction

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like. Typically, a non-volatile memory system has a memory controller that controls access of a host system to non-volatile memory in the memory system. The host system may be a computer system, cellular telephone, server, etc. The non-volatile memory system and host system may exchange data over, for example, a Peripheral Component Interconnect Express (PCIe) bus. Non-volatile Memory Express (NVMe) is a logical device interface specification for accessing non-volatile storage attached via a PCIe bus. NVMe takes advantage of parallelism offered by semiconductor memory such as, but not limited to, SSDs.

The memory controller can typically have some amount of volatile memory, which it may use for a variety of tasks. For example, the volatile memory can be used to cache a portion of a management table that is used to translate between logical addresses used by the host system and physical addresses in the non-volatile memory. Note that a full version of the management table may be stored in the non-volatile memory. A benefit of caching the management table is that when the memory system receives a read or write request, it can determine which memory location needs to be accessed based on a much quicker lookup in the memory controller's volatile memory. For fast consistent performance, the organization of the management table may be chosen to minimize the amount of computation and number of volatile memory lookups required at the expense of requiring more volatile memory. The memory controller may use the volatile memory for other purposes.

When SSDs were first introduced, dynamic random-access memory (DRAM) was routinely included as a cache for SSDs and to improve drive performance. The DRAM served as cache for writing data to the SSD, and for storing the mapping tables that keep record of the location of the data on the SSD to allow access to the data. For years, it became the standard to continue to push the limits and gain better performance from SSDs using DRAM. However, there have been major improvements in the SSD interface, NAND technology, SSD controllers and firmware.

Rapid growing volumes of generated data from various connected users and devices are raising the storage demand on data centers. In addition to the connected users, machines such as autonomous vehicles and video streaming devices can generate a greater volume of content. This is also leading to an increased demand for storage capacity of SSDs.

Coupled with the desire to increase both performance and storage capacity efficiently, the storage device industry has attempted to solve the increasing demand of the SSD capacity. A most common approach has been to increase the storage capacity of SSDs by increasing the number of word lines (or block size) and increasing the density of the blocks per die, which is a technology change in the NAND flash industry that requires a significant investment in resources and is cost burdensome.

SUMMARY

One aspect of a storage device is disclosed herein. The storage device includes a switch, a memory and a controller. The memory includes a plurality of non-volatile memory packages coupled to the switch, in which each of the plurality of non-volatile memory packages comprises a plurality of non-volatile memory dies. The controller is configured to select a non-volatile memory package of the plurality of non-volatile memory packages with the switch. The controller is also configured to establish a data channel connection between the selected non-volatile memory package and the controller via the switch, in which the selected non-volatile memory package is transitioned into an active mode and one or more non-selected non-volatile memory packages in the plurality of non-volatile memory packages are each transitioned into a standby mode. The controller is also configured to perform one or more storage device operations with one or more non-volatile memory dies of the plurality of non-volatile memory dies within the selected non-volatile memory package.

Another aspect of a storage device is disclosed herein. The storage device includes a flash interface module, a switch, a memory and a controller. The memory includes a plurality of non-volatile memory packages coupled to the switch, in which each of the plurality of non-volatile memory packages comprises a plurality of non-volatile memory dies and the plurality of non-volatile memory packages are connected to a same data channel of the flash interface module. The controller is configured to select a non-volatile memory package of the plurality of non-volatile memory packages with the switch. The controller is also configured to establish a data channel connection between the selected non-volatile memory package and the controller via the switch, in which the selected non-volatile memory package is transitioned into an active mode and one or more non-selected non-volatile memory packages in the plurality of non-volatile memory packages are each transitioned into a standby mode. The controller is also configured to perform one or more storage device operations with one or more non-volatile memory dies of the plurality of non-volatile memory dies within the selected non-volatile memory package.

A further aspect of a storage device is disclosed herein. The storage device includes a flash interface module, a switch coupled to the flash interface module, a memory and a controller. The memory includes a plurality of non-volatile memory packages coupled to the switch, in which each of the plurality of non-volatile memory packages comprises a plurality of non-volatile memory dies. The controller is configured to translate a logical block address from a host device to a physical address on the storage device with one or more flash translation layer control tables. The controller is also configured to send a command signal to the switch that causes the switch to select a non-volatile memory package of the plurality of non-volatile memory packages that corresponds to the physical address by locking the non-volatile memory package to one of a plurality of data channels of the flash interface module. The controller is also configured to establish a data channel connection between the selected non-volatile memory package and the controller via the switch, in which the selected non-volatile memory package is transitioned into an active mode and one or more non-selected non-volatile memory packages in the plurality of non-volatile memory packages are each transitioned into a standby mode. The controller is also configured to perform one or more storage device operations with one or more non-volatile memory dies of the plurality of non-volatile memory dies within the selected non-volatile memory package.

It is understood that other aspects of the storage device will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present disclosure will now be presented in the detailed description by way of example, and not by way of limitation, with reference to the accompanying drawings, wherein.

DETAILED DESCRIPTION

The detailed description set forth below in connection with the appended drawings is intended as a description of various exemplary embodiments of the present disclosure and is not intended to represent the only embodiments in which the present disclosure may be practiced. The detailed description includes specific details for the purpose of providing a thorough understanding of the present disclosure. However, it will be apparent to those skilled in the art that the present disclosure may be practiced without these specific details. In some instances, well-known structures and components are shown in block diagram form in order to avoid obscuring the concepts of the present disclosure. Acronyms and other descriptive terminology may be used merely for convenience and clarity and are not intended to limit the scope of the disclosure.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the disclosure include the described components, structure, features, functionality, processes, advantages, benefits, or modes of operation.

As used herein, the term "coupled" is used to indicate either a direct connection between two components or, where appropriate, an indirect connection to one another through intervening or intermediate components. In contrast, when a component referred to as being "directly coupled" to another component, there are no intervening elements present.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present disclosure, with the understanding that such aspects may have a wide range of applications without departing from the spirit and scope of the present disclosure. For example, while the following description refers to SSDs, the description may similarly apply to other flash storage devices.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. One example of the firmware is a flash translation layer. In operation, when a host device needs to read data from or write data to the flash memory, it will communicate with the flash memory controller. In one embodiment, if the host device provides a logical address to which data is to be read/written, the flash memory controller can convert the logical address received from the host to a physical address in the flash memory. The flash memory controller also can perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

NAND technology is growing to reduce the bit cost and increase the bit density. The change in technology affects the manner by which NAND flash can interact with a flash memory controller. For example, next-generation NAND flash memories (e.g., BiCS6, BiCS7, or later generations) may not support Single Data Rate (SDR) mode. In some aspects, legacy generation storage devices, such as NAND memory controllers, may be implemented with command (CMD) lines (e.g., NAND commands) in SDR mode and data lines in Double Data Rate (DDR) mode; however, these next-generation NAND flash memories may not be consumed with legacy-generation flash memory controllers.

Effectively, a memory generation transition with the legacy-generation flash memory controllers may not feasible such that flash memory controller designs may require Read-Only Memory (ROM) code tape-out. However, flash memory controller ROM code tape-out is a burdensome process that significantly increases production costs of the storage device including a resource-consuming effort by SSD manufacturers.

SSD drive capacity may be limited by the number of NAND Ball Grid Arrays (BGAs), which in turn is limited by the number of channels through a Flash Interface Module (FIM). In some aspects, NAND BGAs can include 4, 8 or 16 dies, of which the total capacity in each respective die of a storage device can be determined as 480 gigabyte (GB), 512 GB or 1 TB, respectively. In some legacy approaches to storage device design, the number of Flash Interface Modules (FIMs) having Low-level Data Path (LDP) channels can be a deciding factor in the determination of the number of NAND BGAs implemented in a storage device system. These legacy approaches may lack a mechanism to increase the storage capacity (e.g., by increasing the number of NAND BGAs) without increasing the number of LDP channels, because increasing the number of LDP channels can result in significant increases in product cost and technical complexity to the overall storage device system design.

The subject technology provides for a firmware-controlled switch that is configured to control data channel connections to NAND BGAs. The switch may be implemented between the FIM and a set of NAND BGAs and may be configured to select a NAND BGA (or non-volatile memory package) based on a Logical Block Address (LBA) mapping that is provided by (or controlled from) a Flash Transition Layer (FTL) module, while the rest of the NAND BGAs are transitioned into a standby mode (e.g., an inactive data path).

The FTL module may maintain virtual images for each NAND package to handle FTL control tables for data access across all sections. The controller also may be configured to handle dynamic package additions, whereas the FTL may control a hardware switch and use existing flash data channels across all the NAND BGAs. As explained above, the FTL can trigger the hardware switch to lock a corresponding NAND BGA to the flash data channels based on a physical location of the NAND BGA.

The firmware in the controller may be configured to support a number of dynamic threads based on a number of detected BGAs during a boot-up sequence. Each NAND BGA may be accessible as an independent entity based on an initialization configuration, in which a total SSD drive capacity of the storage device can be reported to a host device. At a time of switching between non-volatile memory packages, the FTL control tables can be flushed with respect to the active non-volatile memory package and new FTL tables with respect to a next non-volatile memory package can be loaded to a volatile memory (e.g., RAM) for data access. Typical host read/write operations may be performed with die parallelism within the selected non-volatile memory package based on a specified package configuration (e.g., 4, 8 or 16 non-volatile memory dies).

In one embodiment, the present disclosure provides for the hardware switch to facilitate consumption of a latest generation three-dimensional (3D) NAND memories using a legacy memory controller. In some aspects, in the event of a NAND memory upgrade, the hardware switch can be used to select other generations of NAND BGAs to boost the performance without compromising a legacy boot-up process.

The subject technology provides several advantages over legacy storage devices by allowing higher storage capacities in storage devices without significant changes in existing system hardware (e.g., controller and data path design). The firmware-controlled switch framework for switching between NAND BGAs in a flash pool to increase the storage capacity of a storage device may not have a limit to the number of NAND BGAs connected to a data channel. The subject technology may provide optimized power and thermal configurations for the increase in storage capacity. The subject technology also allows for the memory controller to interface with a mixed generation of NAND BGAs such that the storage device can receive the benefits of next-generation of flash memories (e.g., higher DDR interface speeds). In this regard, only firmware may require an upgrade or version modification (e.g., no hardware modifications) in the case of the memory controller interfacing with the mixed generation of NAND BGAs.

Figure 1:
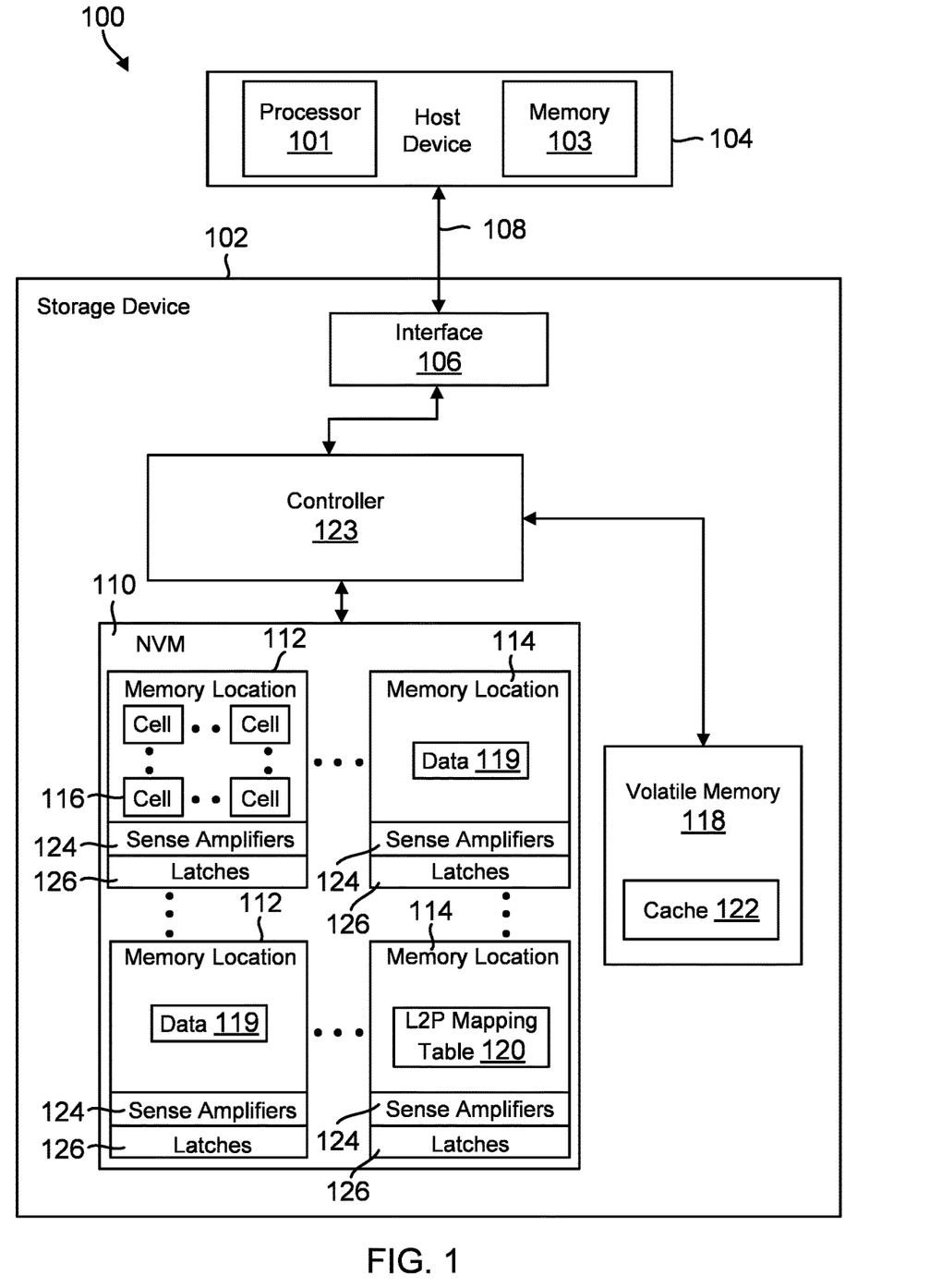
FIG. 1 is a block diagram illustrating an exemplary embodiment of a storage device in communication with a host device.

FIG. 1 shows an exemplary block diagram 100 of a storage device 102 which communicates with a host device 104 (also "host") according to an exemplary embodiment. The host device 104 and the storage device 102 may form a system, such as a computer system (e.g., server, desktop, mobile/laptop, tablet, smartphone, etc.). The components of FIG. 1 may or may not be physically co-located. In this regard, the host device 104 may be located remotely from storage device 102. Although FIG. 1 illustrates that the host device 104 is shown separate from the storage device 102, the host device 104 in other embodiments may be integrated into the storage device 102, in whole or in part. Alternatively, the host device 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a CPU), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), DRAM, static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host device 104 via a bus/network 108, and may interface using, for example, Ethernet or WiFi, or a bus standard such as Serial Advanced Technology Attachment (SATA), PCIe, Small Computer System Interface (SCSI), or Serial Attached SCSI (SAS), among other possible candidates. Alternatively, the host interface 106 may be wireless, and may interface the storage device 102 with the host device 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra-Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

The storage device 102 includes a memory. For example, in the exemplary embodiment of FIG. 1, the storage device 102 may include a non-volatile memory (NVM) 110 for persistent storage of data received from the host device 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. In some aspects, NVM 110 may be referred to as "NAND BGA." The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the exemplary embodiment of FIG. 1, each memory location 112 may be a die 114 including multiple planes each including multiple blocks of multiple cells 116. Alternatively, each memory location 112 may be a plane including multiple blocks of the cells 116. The cells 116 may be single-level cells, multi-level cells, triple-level cells, quad-level cells, and/or penta-level cells, for example. Other examples of memory locations 112 are possible; for instance, each memory location may be a block or group of blocks. Each memory location may include one or more blocks in a 3-D NAND array. Each memory location 112 may include one or more logical blocks which are mapped to one or more physical blocks. Alternatively, the memory and each memory location may be implemented in other ways known to those skilled in the art.

The storage device 102 also includes a volatile memory 118 that can, for example, include a DRAM or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host device 104 to physical addresses in the NVM 110 indicating the location(s) where each of the data is stored. This mapping may be performed by the controller 123 of the storage device. The L2P mapping table may be a table or other data structure which includes an identifier such as a LBA associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
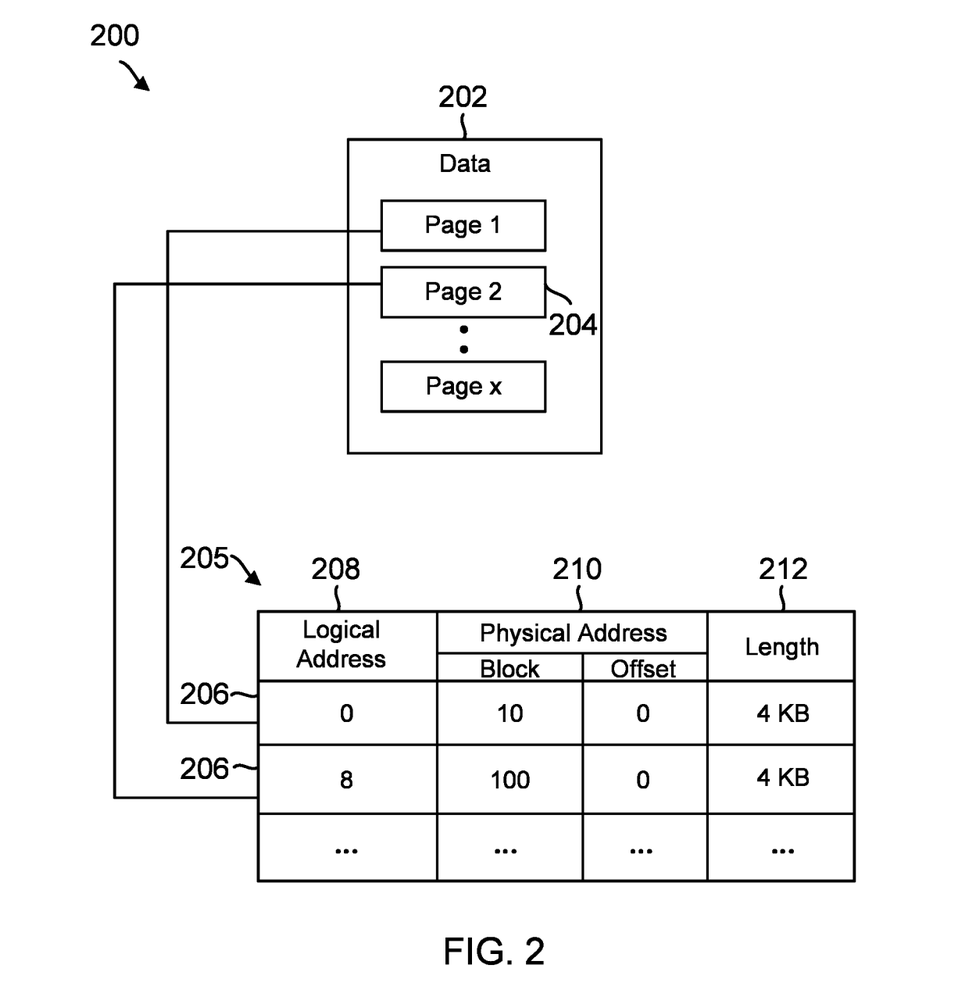
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a LBA 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host device 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller 123 accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an ASIC, a FPGA, hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller 123 may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The host interface 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller 123 also stores the length of the L2P mapped data. The controller 123 then stores the data in the memory location 112 by sending it to one or more data latches 126 connected to the allocated memory location, from which the data is programmed to the cells 116.

The host device 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host device 104 via the host interface 106.

Figure 3:
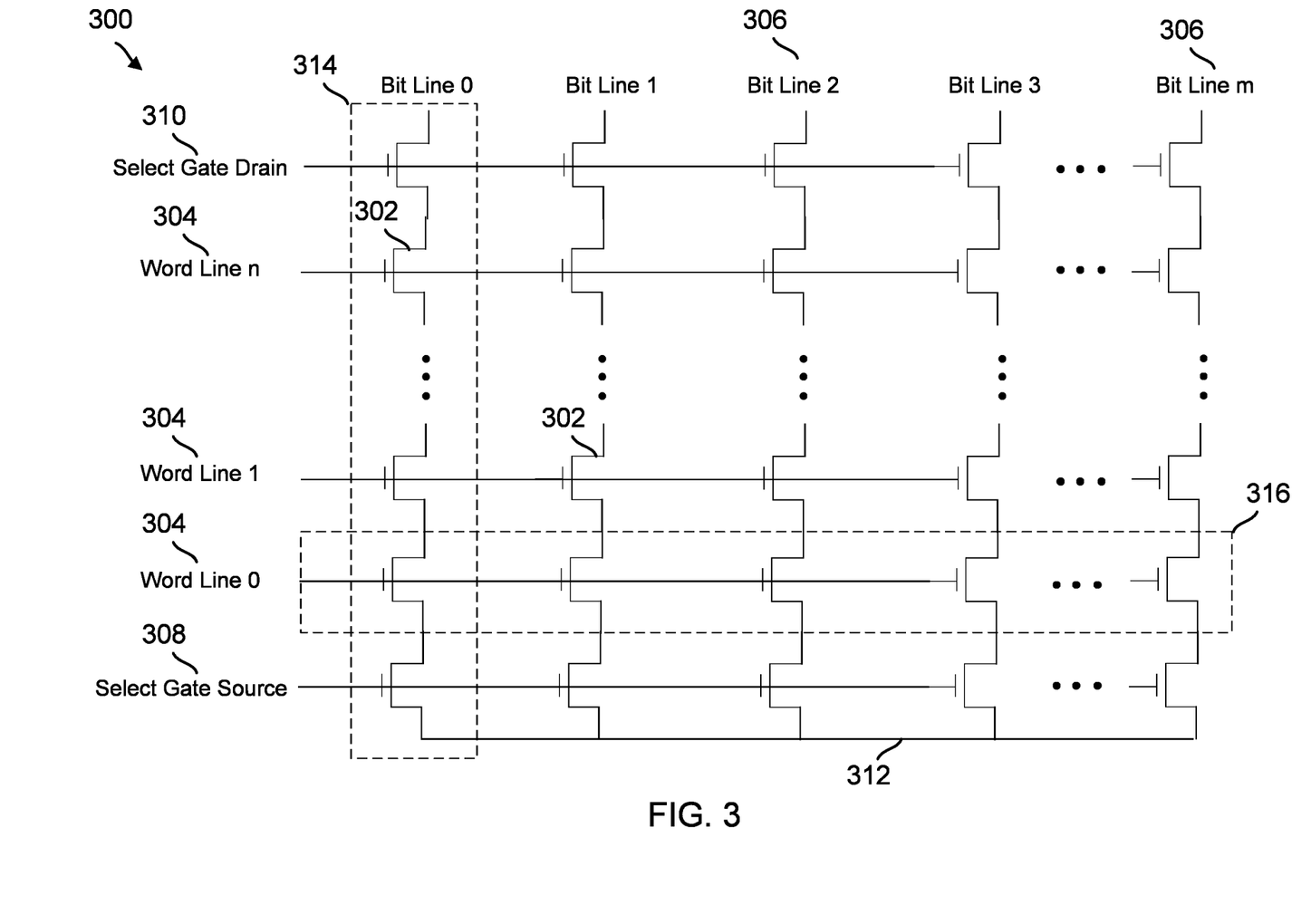
FIG. 3 is a conceptual diagram illustrating an example of an array of memory cells in the storage device of FIG. 1.

FIG. 3 illustrates an example of a NAND memory array 300 of cells 302. Cells 302 may correspond to cells 116 in the NVM 110 of FIG. 1. Multiple cells 302 are coupled to word lines 304 and bit lines 306. For example, the memory array 300 may include n word lines and m bit lines within a block of a die 114 of the NVM 110, where n and m are predefined according to the size of the block. Each word line and bit line may be respectively associated with a row and column address, which the controller 123 may use to select particular word lines and bit lines (e.g. using a row and column decoder). For example, word lines 0-n may each be associated with their own row address (e.g. word line 0 may correspond to word line address 0, word line 1 may correspond to word line address 1, etc.), and bit lines 0-m may each be associated with their own column address (e.g. bit line 0 may correspond to bit line address 0, bit line 1 may correspond to bit line address 1, etc.). Select gate source (SGS) cells 308 and select gate drain (SGD) cells 310 are coupled to the memory cells 302 on each bit line 306. The SGS cells 308 and SGD cells 310 connect the memory cells 302 to a source line 312 (e.g. ground) and bit lines 306, respectively. A string 314 may include a group of cells 302 (including SGS and SGD cells 308, 310) coupled to one bit line within a block, while a page 316 may include a group of cells 302 coupled to one word line within the block.

Figure 4:
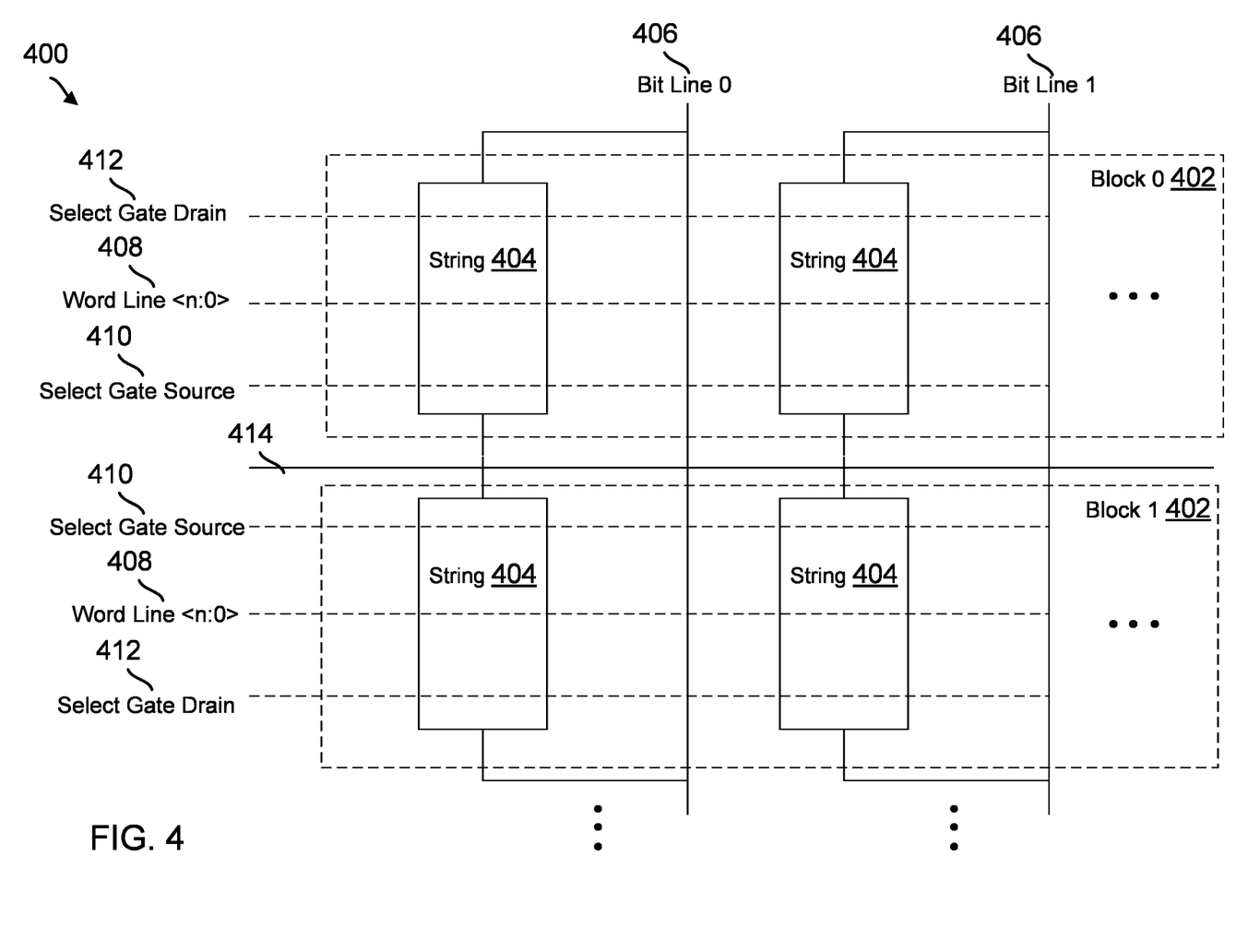
FIG. 4 is a conceptual diagram illustrating an example of an array of blocks in the storage device of FIG. 1.

FIG. 4 illustrates an example of a NAND memory array 400 of blocks 402 including multiple strings 404. Blocks 402 may correspond to blocks of a die 114 in the NVM 110 of FIG. 1, and strings 404 may each correspond to string 314 in FIG. 3. As in the memory array 300 of FIG. 3, each string 404 may include a group of memory cells each coupled to a bit line 406 and individually coupled to respective word lines 408. Similarly, each string may include a SGS cell 410 and SGD cell 412 which respectively connects the memory cells in each string 404 to a source line 414 and bit line 406.

When the controller 123 reads data from or writes data to a page 316 of cells 302 (i.e. on a word line 304, 408), the controller 123 may send a command to apply a read voltage or program voltage to the selected word line and a pass through voltage to the other word lines. The read or programmed state of the cell (e.g. a logic '0' or a logic '1' for SLCs) may then be determined based on a threshold voltage of the cells 302. For example, during an SLC read operation, if the threshold voltage of a cell 302 is smaller than the read voltage (i.e. current flows through the cell in response to the read voltage), the controller 123 may determine that the cell stores a logic '1', while if the threshold voltage of the cell 302 is larger than the read voltage (i.e. current does not flow through the cell in response the read voltage), the controller 123 may determine that the cell stores a logic '0'. Similarly, during an SLC program operation, the controller 123 may store a logic '0' by sending a command to apply the program voltage to the cell 302 on the word line 304, 408 until the cell reaches the threshold voltage, and during an erase operation, the controller 123 may send a command to apply an erase voltage to the block 402 including the cells 302 (e.g. to a substrate of the cells such as a p-well) until the cells reduce back below the threshold voltage (back to logic '1').

For cells that store multiple bits (e.g. MLCs, TLCs, etc.), each word line 304, 408 may include multiple pages 316 of cells 302, and the controller 123 may similarly send commands to apply read or program voltages to the word lines to determine the read or programmed state of the cells based on a threshold voltage of the cells. For instance, in the case of TLCs, each word line 304, 408 may include three pages 316, including a lower page (LP), a middle page (MP), and an upper page (UP), respectively corresponding to the different bits stored in the TLC. In one example, when programming TLCs, the LP may be programmed first, followed by the MP and then the UP. For example, a program voltage may be applied to the cell on the word line 304, 408 until the cell reaches a first intermediate threshold voltage corresponding to a least significant bit (LSB) of the cell. Next, the LP may be read to determine the first intermediate threshold voltage, and then a program voltage may be applied to the cell on the word line until the cell reaches a second intermediate threshold voltage corresponding to a next bit of the cell (between the LSB and the most significant bit (MSB)). Finally, the MP may be read to determine the second intermediate threshold voltage, and then a program voltage may be applied to the cell on the word line until the cell reaches the final threshold voltage corresponding to the MSB of the cell. Alternatively, in other examples, the LP, MP, and UP may be programmed together (e.g., in full sequence programming or Foggy-Fine programming), or the LP and MP may be programmed first, followed by the UP (e.g., LM-Foggy-Fine programming). Similarly, when reading TLCs, the controller 123 may read the LP to determine whether the LSB stores a logic 0 or 1 depending on the threshold voltage of the cell, the MP to determine whether the next bit stores a logic 0 or 1 depending on the threshold voltage of the cell, and the UP to determine whether the final bit stores a logic 0 or 1 depending on the threshold voltage of the cell.

Figure 5:
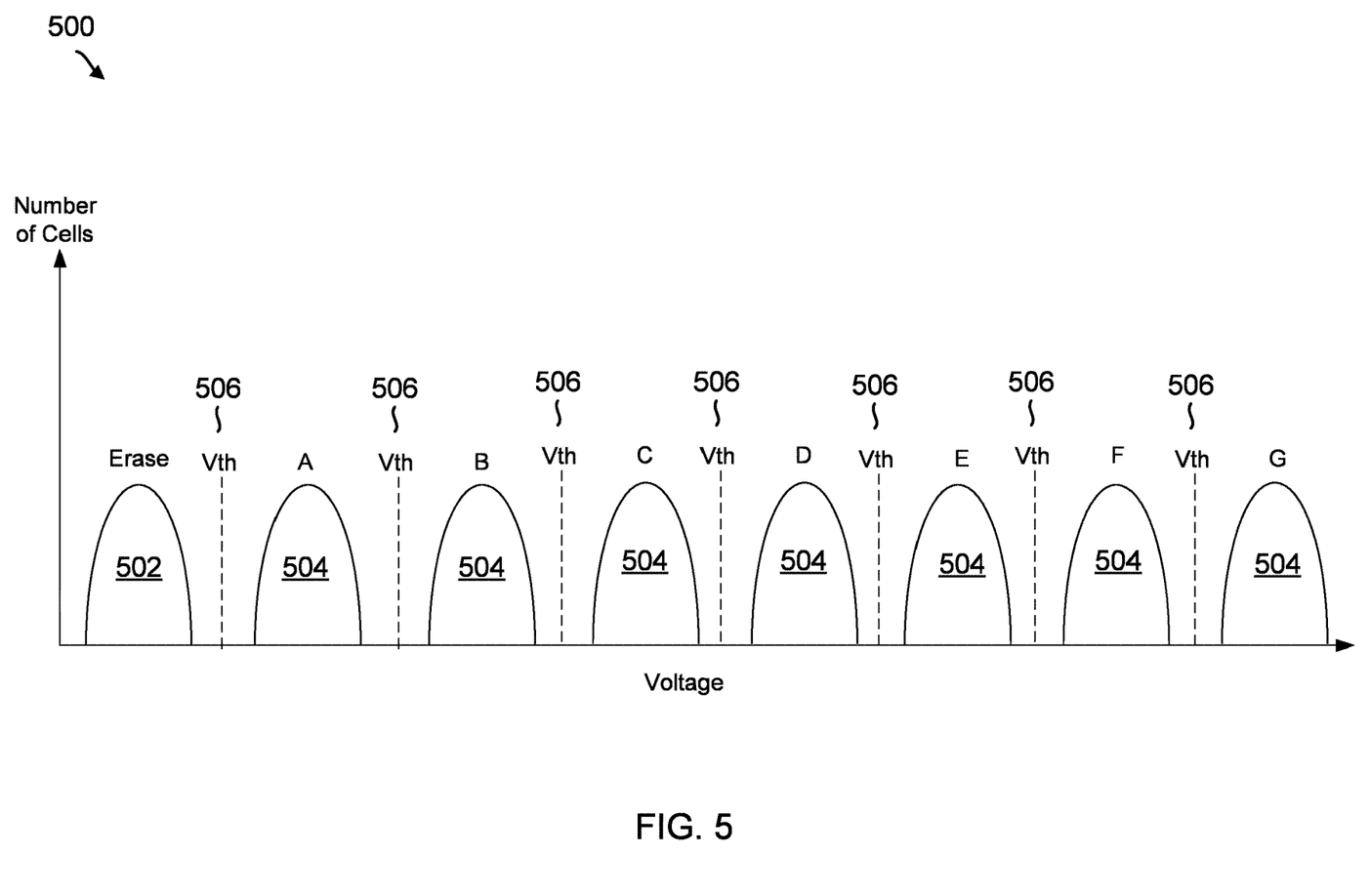
FIG. 5 is a graphical diagram illustrating an example of a voltage distribution chart for triple-level cells in the storage device of FIG. 1.

FIG. 5 illustrates an example of a voltage distribution chart 500 illustrating different NAND states for TLCs (e.g. cells 116, 302) storing three bits of data (e.g. logic 000, 001, etc. up to logic 111). The TLCs may include an erase state 502 corresponding to logic '111' and multiple program states 504 (e.g. A-G) corresponding to other logic values '000-110'. The program states 504 may be separated by different threshold voltages 506. Initially, the cells 116, 302 may be in the erase state 502, e.g. after the controller 123 erases a block 402 including the cells. When the controller 123 program LPs, MPs, and UPs as described above, the voltages of the cells 116, 302 may be increased until the threshold voltages 506 corresponding to the logic values to be stored are met, at which point the cells transition to their respective program states 504. While FIG. 5 illustrates eight NAND states for TLCs, the number of states may be different depending on the amount of data that is stored in each cell 116, 302. For example, SLCs may have two states (e.g. logic 0 and logic 1), MLCs may have four states (e.g. logic 00, 01, 10, 11), and QLCs may have sixteen states (e.g. erase and A-N).

When the controller 123 attempts to program cells 116, 302 of a selected word line 304, 408 into one of the program states 504, the controller 123 may perform incremental step pulse programming (ISPP) over a number of programming loops or ISPP cycles. For example, a programming voltage (e.g. a high voltage) may be applied to the selected word line 304, 408, a pass through voltage (e.g. a high voltage lower than the programming voltage) may be applied to the other word lines 304, 408, a bit line program voltage (e.g. a low voltage) may be applied on the bit lines 306, 406 connected to the selected cells being programmed on the selected word line, and a bit line inhibit voltage (e.g. a high voltage) may be applied on the bit lines 306, 406 connected to the other cells not being programmed on the selected word line. Applying a high programming voltage to the selected word line and a low voltage to the selected bit lines allows electrons to tunnel from the channel into the charge trapping layer of those selected cells, thereby causing the threshold voltage of the cells to increase. On the other hand, applying a high voltage to unselected bit lines inhibits electrons from tunneling from the channel into the charge trapping layer of those unselected cells, thereby preventing the threshold voltage of those cells from increasing. Thus, bit lines coupled to cells programmed to lower states may be inhibited to prevent the threshold voltage of those cells from increasing while other cells are programmed to higher states. For instance, in the case of TLCs, the bit lines of cells that are first programmed into the A state may be inhibited first, followed by the bit lines of different cells that are programmed into the B state, followed by those that reach the C state, then the D state, and so forth until the remaining cells on the selected word line ultimately reach the G state and all cells on the selected word line have been programmed.

After the programming voltage is applied in one programming loop or ISPP cycle, a program verify voltage (e.g. a low voltage) may be applied to the word line 304, 408 to determine whether the threshold voltage of a cell has increased beyond a respective threshold voltage into an intended program state. If none of the cells have transitioned into an intended programming state, then another programming loop or ISPP cycle is performed in which a higher programming voltage may be applied to further increase the threshold voltage of the cells. Subsequently, a program verify voltage may again be applied to determine whether the threshold voltage of a cell has transitioned into an intended program state. The above process of incrementally increasing the programming voltage and verifying the voltage threshold of the selected cells may be repeated over a number of programming loops. If the cells transition into their respective programming states and the total number of programming loops does not exceed a predetermined loop count, the controller 123 may determine that the cells have entered their intended program states and are thus successfully programmed. Otherwise, if the total number of programming loops exceeds the predetermined loop count before the cells transition into their respective programming states, the controller 123 may determine that a program failure has occurred.

Figure 6:
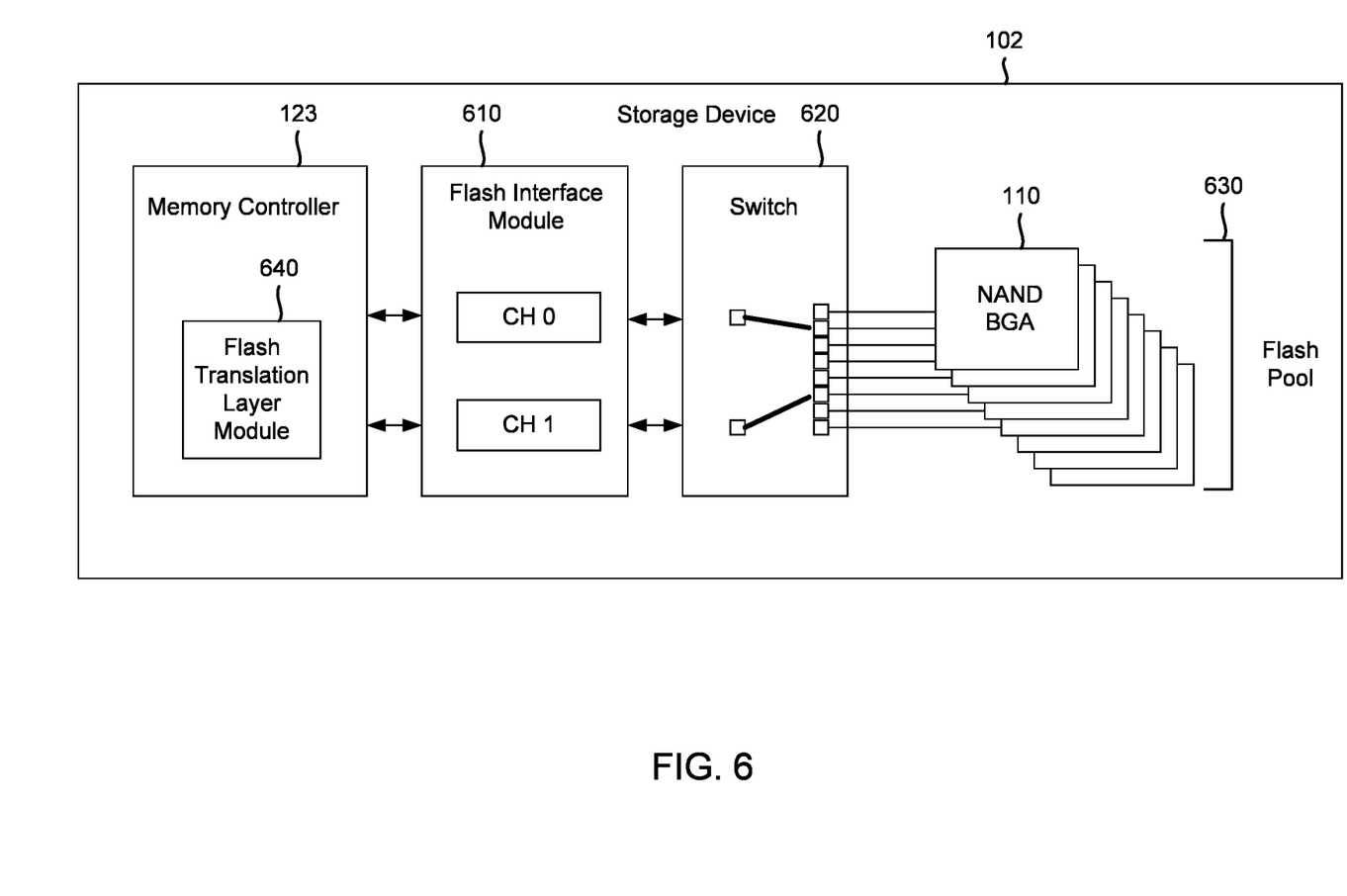
FIG. 6 is a conceptual diagram illustrating an example of a switch based ball grid array extension in the storage device of FIG. 1.

FIG. 6 is a conceptual diagram illustrating an example of a switch based ball grid array extension in the storage device 102 of FIG. 1. The storage device 102 includes the controller 123, a flash interface module 610, a switch 620 and a flash pool 630. The controller 123 includes a flash translation layer module 640.

The present disclosure provides for an improvement in storage devices by increasing the SSD capacity with minimal changes in legacy storage product design (e.g., flash memory controller and hardware accelerators). As previously discussed above, SSD capacity can be limited by the number of connected NAND BGAs to the storage device system, which in turn is limited by the number of channels through the flash interface module 610. In this regard, the subject technology provides for increasing the number of connected BGAs using a switch-based mechanism, such as a firmware-controlled switch that can control the data channel connection between the NAND BGAs and the controller 123, which can result in an increase in the SSD capacity of the storage device by multiple folds. For example, a typical SSD storage device with a storage capacity of 1 terabyte (TB) can have 16 dies per NAND BGA with each NAND BGA having a storage capacity of about 512 GB. In some aspects, the NAND BGAs may be connected to a same data channel of the flash interface module 610. In this regard, the subject technology can allow for 10 or more NAND BGAs to be connected to a same data channel to increase the total storage device capacity to 10 TB or more.

In some aspects, the switch 620 may be implemented between the flash interface module 610 and the flash pool 630 (e.g., including a set of NAND BGAs 110) and the switch 620 may be configured to select a NAND BGA (or non-volatile memory package) from the flash pool 630 based on a LBA mapping that is provided by (or controlled from) the flash translation layer module 640, while the rest of the NAND BGAs 110 are transitioned into a standby mode (e.g., an inactive data path). For example, the controller 123 may be configured to identify a NAND BGA for selection based on the LBA mapping from one or more flash translation layer control tables at the flash translation layer module 640 of the controller 123. In some aspects, each inactive data path to a NAND BGA in standby mode may consume a specified amount of power that correspond to (or is lower than) a standard power limit for standard SATA storage devices.

In one embodiment, the present disclosure provides for the switch 620 to facilitate consumption of latest generation 3D NAND memories using the controller 123 as a legacy controller. In this regard, the legacy controller can support heterogeneous NAND memory generations (e.g., legacy generation NAND memory, next-generation NAND memory). In some aspects, in the event of a NAND memory upgrade, the switch 620 can be used to select other generations of NAND BGAs to boost the performance without compromising a legacy boot-up process. In some aspects, the controller 123 may select a first non-volatile memory package with the switch during an initialization phase and select a second non-volatile memory package with the switch during a runtime phase, in which the second non-volatile memory package is different than the first non-volatile memory package in terms of performance. For example, the controller 123 may select a legacy NAND BGA to run the boot-up sequence during an initialization phase, and thereafter, the controller 123 can select a next-generation NAND BGA to perform read and/or write operations during a runtime phase. In this regard, the legacy NAND BGA and the next-generation NAND BGA are different NAND BGAs are different in terms of performance (e.g., legacy NAND BGA with SDR interface, next-generation NAND BGA with DDR interface).

In one embodiment, the flash translation layer module 640 can perform memory management (e.g., garbage collection, wear leveling, etc.), logical-to-physical address translation, communication with the host, management of DRAM (local volatile memory) and management of the overall operation of the storage device 102 (or other non-volatile storage system). For example, the flash translation layer module 640 may be configured to translate logical block addresses from the host device 104 to physical addresses on the storage device 102. In some aspects, the flash translation layer module 640 is a type of address translation layer that may implement several functions for operating NAND BGAs (e.g., 110) in the flash pool 630, such as mapping logical addresses for data to physical addresses storing the data (e.g., L2P mapping(s)), wear-leveling to evenly distribute write operations among blocks of pages to prolong a usable life of NAND memory in the flash pool 630, error correction for data read from one or more NAND BGAs 110, Garbage Collection (GC) to reclaim portions of NAND BGAs 110 that store invalid or obsolete data, and/or handling defective blocks in the NAND BGAs 110. The flash translation layer module 640 may use L2P mappings, which may have a finer granularity than a logical to physical granularity of a logical block-based file system executed by the host device 104.

In legacy SSD product designs, the NAND BGAs may be hardwired to the flash interface module 610 by the number of BGAs connected per data path (or channel). However, there may be no physical limitation to the number of BGAs that can be connected per data channel in the flash interface module 610. In this regard, the number of NAND BGAs can be increased up to a specified storage device power requirement. In some aspects, the controller 123 may drive a first current to a selected non-volatile memory package and a second current to each of the one or more non-selected non-volatile memory packages via the switch 620. For example, the controller 123 may drive a current of at least 100 μA on an active data path, whereas the controller 123 may drive a current of about 13 μA on the standby data path (or inactive data path). In this regard, the selected non-volatile memory package in the active mode is connected to an active data path with a first power consumption based on the first current and each of the one or more non-selected non-volatile memory packages in the standby mode is coupled to a standby data path with a second power consumption smaller than the first power consumption based the second current and a number of the plurality of non-volatile memory dies in each of the one or more non-selected non-volatile memory packages. For example, the specified minimum power that may be driven on an inactive data path for a 16-die BGA package may be about 700 μW. This may be calculated as 16 dies (e.g., maximum number per NAND BGA) with a drive current of 13 μA at an I/O voltage of 3.3 V, which is significantly less compared to the active data path power consumption.

In a process of increasing the physical storage capacity of the storage device, one or more NAND BGAs 110 may be added to the flash pool 630 rather than components (and/or devices) being added to the controller 123. The controller 123 and surrounding logic including the flash translation layer module 640 may be configured to detect the increased physical storage capacity through a firmware configuration, where the controller 123 and/or the flash translation layer module 640 may synchronize to the newly-inserted raw flash as part of an initialization for the flash pool 630. In addition, the controller 123 may dynamically adjust (or modify) the wear levelling and GC operation logic to accommodate the newly-inserted raw flash in terms of block budget for control and capacity.

The flash translation layer module 640 may maintain virtual images for each NAND BGA 110 to handle FTL control tables for data access across all sections. The controller 123 also may be configured to handle dynamic package additions, whereas the flash translation layer module 640 may control the switch 620 and use existing flash data channels across all the NAND BGAs 110. As explained above, the flash translation layer module 640 can trigger the switch 620 with a command signal to lock a corresponding NAND BGA to the flash data channels based on a physical location of the NAND BGA 110.

The firmware in the controller 123 may be configured to support a number of dynamic threads based on a number of detected BGAs during a boot-up sequence in an initialization phase. In some aspects, each of the dynamic threads may correspond to a different NAND BGA 110. Each NAND BGA 110 may be accessible as an independent entity based on an initialization configuration, in which a total SSD drive capacity of the storage device can be reported to a host device (e.g., 104 of FIG. 1). For example, the controller 123 may perform an initialization configuration with each of the detected number of NAND BGAs 110 during the initialization phase, determine a total capacity of the detected number of NAND BGAs based on the initialization configuration and send a report indicating the determined total capacity to a host device (e.g., 104 of FIG. 1). At a time of switching between the NAND BGAs 110 (e.g., transition from a first NAND BGA to a second NAND BGA via the switch 620), the FTL control tables can be flushed with respect to the active NAND BGA and new FTL tables with respect to a next NAND BGA can be loaded to a volatile memory (e.g., RAM) for data access. Typical host read/write operations may be performed with die parallelism within the selected NAND BGA based on a specified package configuration (e.g., 4, 8 or 16 non-volatile memory dies).

Figure 7:
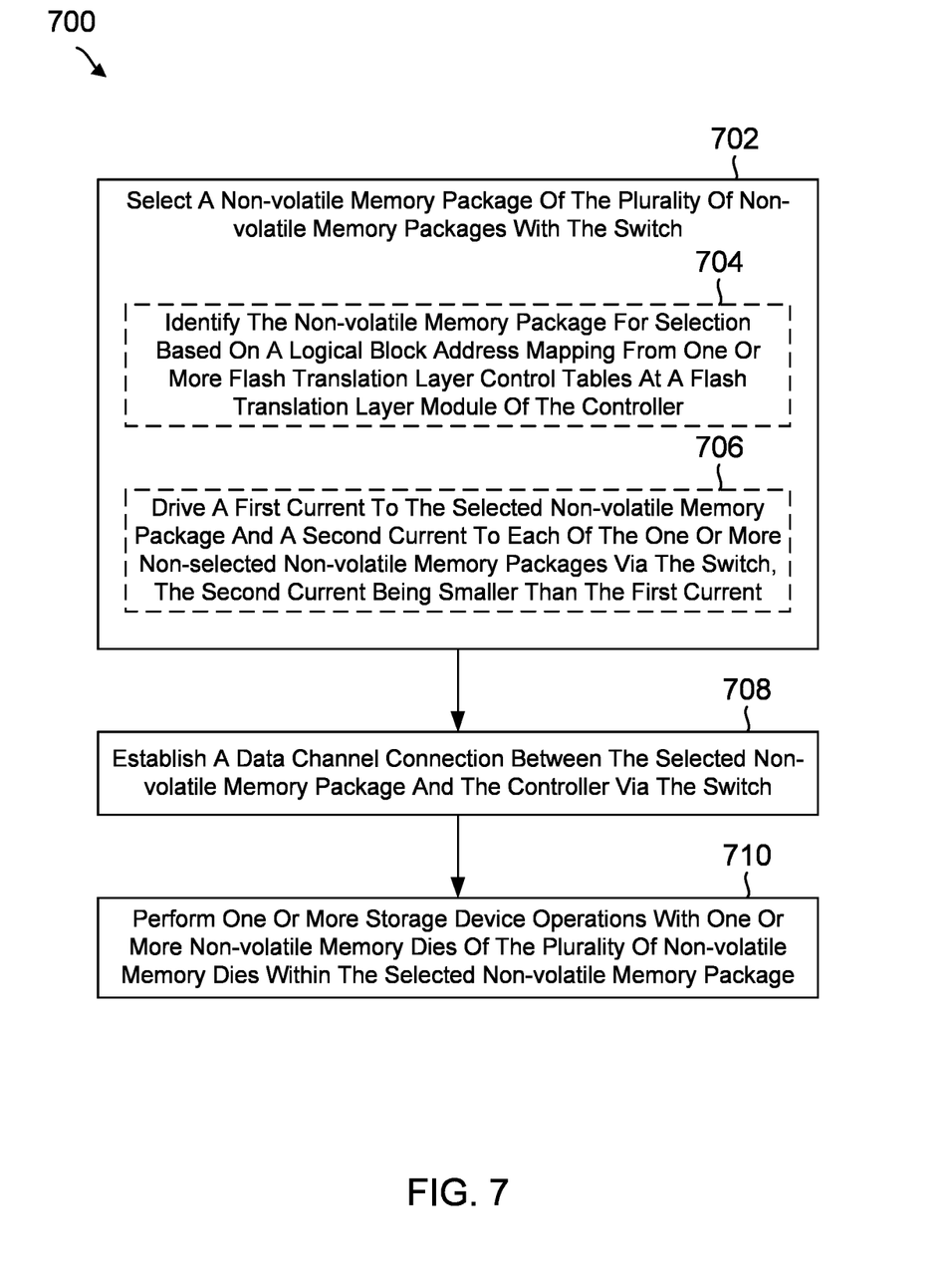
FIG. 7 illustrates an example flow chart of an exemplary process of switching between non-volatile memory packages using a switch based ball grid array extension, as performed by the storage device of FIG. 1.

FIG. 7 illustrates an example flow chart of an exemplary process 700 of switching between non-volatile memory packages using a switch based ball grid array extension. For example, the process 700 can be carried out in a storage device 102 such as the one illustrated in FIG. 1. Each of the steps in the flow chart can be controlled using the controller as described below (e.g. controller 123), by a component or module of the controller, or by some other suitable means.

As represented by block 702, the controller may select a non-volatile memory package of the plurality of non-volatile memory packages with the switch. For example, as represented by block 704, the controller may identify the non-volatile memory package for selection based on a logical block address mapping from one or more flash translation layer control tables at a flash translation layer module of the controller. In another example, as represented by block 706, the controller may drive a first current to the selected non-volatile memory package and a second current to each of the one or more non-selected non-volatile memory packages via the switch, the second current being smaller than the first current.

As represented by block 708, the controller may establish a data channel connection between the selected non-volatile memory package and the controller via the switch, wherein the selected non-volatile memory package is transitioned into an active mode and one or more non-selected non-volatile memory packages in the plurality of non-volatile memory packages are each transitioned into a standby mode.

As represented by block 710, the controller may perform one or more storage device operations with one or more non-volatile memory dies of the plurality of non-volatile memory dies within the selected non-volatile memory package.

Figure 8:
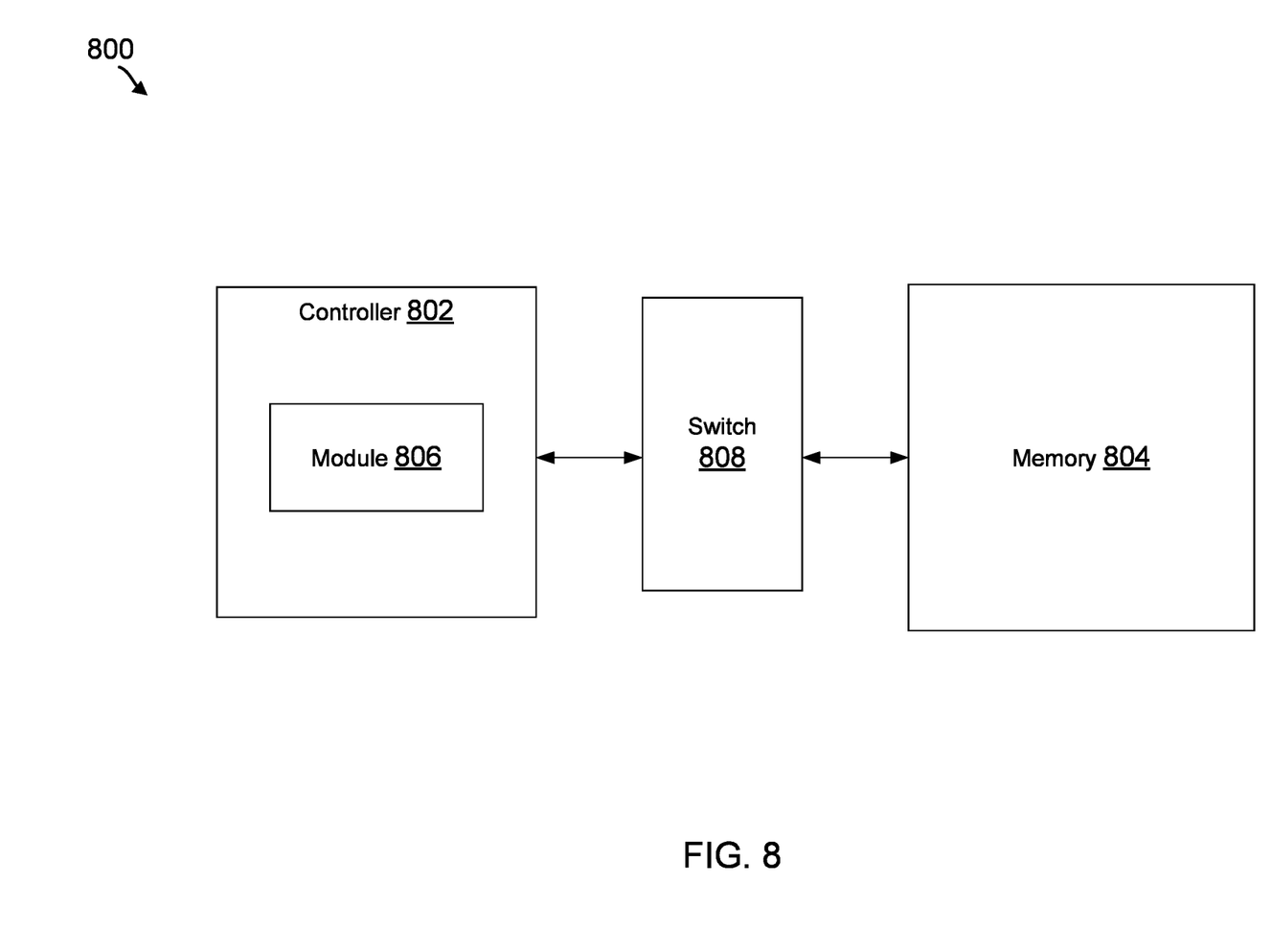
FIG. 8 is a conceptual diagram illustrating an example of a controller coupled to a memory in a storage device for facilitating non-volatile memory package switching using a switch based ball grid array extension in the storage device of FIG. 1.

FIG. 8 is a conceptual diagram illustrating an example 800 of a controller 802 coupled to a memory 804 via a switch 808 in a storage device for facilitating non-volatile memory package switching using a switch based ball grid array extension in the storage device 102 of FIG. 1. For example, controller 802 may correspond to controller 123 and memory 804 may correspond to the NVM 110 of the storage device 102 in FIG. 1. The controller 802 includes a module 806. The module 806 may correspond to the flash translation layer module 640 of the storage device 102 in FIG. 6. The switch 808 may correspond to the switch 620 of the storage device 102 in FIG. 6. The controller 802 may be implemented in software, hardware, or a combination of hardware and software. In one exemplary embodiment, the controller is implemented with several software modules executed on one or more processors, but as those skilled in the art will appreciate, the controller may be implemented in different ways. The skilled artisan will readily understand how best to implement the controller based on the particular design parameters of the system.

The module 806 in the controller 802 may provide a means for selecting a non-volatile memory package of the plurality of non-volatile memory packages with a switch. For example, the module 806 may perform the aforementioned process described at 702. In one configuration, the module 806 may be further configured to identify the non-volatile memory package for selection based on a logical block address mapping from one or more flash translation layer control tables at a flash translation layer module of the controller, e.g., as described in connection with 704. In one configuration, the module 806 may be further configured to drive a first current to the selected non-volatile memory package and a second current to each of the one or more non-selected non-volatile memory packages via the switch, the second current being smaller than the first current, e.g., as described in connection with 706. In one configuration, the module 806 may be further configured to translate a logical block address from a host device to a physical address on the storage device with one or more flash translation layer control tables. The controller 802, through coordination with the module 806, may be configured to send a command signal to the switch that causes the switch to lock one of the plurality of non-volatile memory packages that corresponds to the physical address to one of a plurality of data channels of a flash interface module (not shown).

In some aspects, the controller 802 may be configured to detect a number of non-volatile memory packages within the plurality of non-volatile memory packages during an initialization phase, and generate one or more dynamic threads based on the detected number of non-volatile memory packages, in which each of the one or more dynamic threads corresponds to a different non-volatile memory package. The controller 802 may be configured to perform an initialization configuration with each of the detected number of non-volatile memory packages during the initialization phase and determine a total capacity of the detected number of non-volatile memory packages based on the initialization configuration. The controller 802 may be configured to send a report indicating the determined total capacity to a host device.

The controller 802 may provide a means for establishing a data channel connection between the selected non-volatile memory package and the controller via the switch. In some aspects, the selected non-volatile memory package is transitioned into an active mode and one or more non-selected non-volatile memory packages in the plurality of non-volatile memory packages are each transitioned into a standby mode. For example, the controller 802, through coordination with the module 806, may perform the aforementioned process described at 708.

The controller 802 may provide a means for perform one or more storage device operations with one or more non-volatile memory dies of the plurality of non-volatile memory dies within the selected non-volatile memory package. In some aspects, the controller may be configured to perform the one or more storage device operations with the plurality of non-volatile memory dies in parallel within the selected non-volatile memory package.

In some aspects, the controller 802 may transition from a first non-volatile memory package of the plurality of non-volatile memory packages to a second non-volatile memory package of the plurality of non-volatile memory packages via the switch. The controller 802 may flush one or more first flash translation layer control tables associated with the first non-volatile memory package from a volatile memory in response to the transition, and load one or more second flash translation layer control tables associated with the second non-volatile memory package to the volatile memory for data access. In this regard, the controller 802 may select the first non-volatile memory package with the switch during an initialization phase and select the second non-volatile memory package with the switch during a runtime phase, in which the second non-volatile memory package and the first non-volatile memory package correspond to heterogeneous generations of memory that are different in terms of performance. In some aspects, the controller 802 may be configured to perform a boot-up process with the first non-volatile memory package during the initialization phase and perform the one or more storage device operations with the second non-volatile memory package during the runtime phase.

Accordingly, the controller described in the present disclosure improves memory capacity of the storage device by utilizing a hardware switch interfaced between the controller and flash memory, in which the switch is firmware-controlled such that no modifications to the controller or hardware accelerators are required to increase the SSD capacity. For instance, the controller and/or a flash translation layer module (of the controller) may trigger the switch to select between multiple non-volatile memory packages and lock the selected non-volatile memory package to an active data path for data access whereas the remaining non-volatile memory packages are transitioned into a standby mode. In this way, the controller may independently access a selected non-volatile memory package for data access and support an increase in the number of non-volatile memory packages connected to a same data channel with a firmware-based configuration. Accordingly, improvements in memory capacity may be accomplished with minimal changes to controller logic and/or interface to the non-volatile memory pool.

The various aspects of this disclosure are provided to enable one of ordinary skill in the art to practice the present disclosure. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
   a switch;
   a memory comprising a plurality of non-volatile memory packages coupled to the switch, wherein each of the plurality of non-volatile memory packages comprises a plurality of non-volatile memory dies; and
   a controller configured to:
      select a first non-volatile memory package of the plurality of non-volatile memory packages associated with a first generation of memory with the switch,
      perform a boot-up process associated with the first generation of memory using the first non-volatile memory package,
      establish a data channel connection between the selected first non-volatile memory package and the controller via the switch, wherein the selected first non-volatile memory package is transitioned into an active mode and one or more non-selected non-volatile memory packages in the plurality of non-volatile memory packages are each transitioned into a standby mode,
      select a second non-volatile memory package of the plurality of non-volatile memory packages associated with a second generation of memory with the switch using the boot-up process associated with the first generation of memory, the first generation of memory and the second generation of memory corresponding to heterogeneous generations of memory that are different in terms of performance, and
      perform one or more storage device operations with one or more non-volatile memory dies of the plurality of non-volatile memory dies within the selected second non-volatile memory package.

2. The storage device of claim 1, wherein the controller is configured to drive a first current to the selected first non-volatile memory package and a second current to each of the one or more non-selected non-volatile memory packages via the switch, the second current being smaller than the first current.

3. The storage device of claim 2, wherein the selected first non-volatile memory package in the active mode is connected to an active data path with a first power consumption based on the first current and each of the one or more non-selected non-volatile memory packages in the standby mode is coupled to a standby data path with a second power consumption smaller than the first power consumption based the second current and a number of the plurality of non-volatile memory dies in each of the one or more non-selected non-volatile memory packages.

4. The storage device of claim 1, wherein the controller is configured to identify the first non-volatile memory package for selection based on a logical block address mapping from one or more flash translation layer control tables at a flash translation layer module of the controller.

5. The storage device of claim 1, wherein the controller is configured to:
- translate a logical block address from a host device to a physical address on the storage device with one or more flash translation layer control tables; and
- send a the command signal to the switch that causes the switch to lock one of the plurality of non-volatile memory packages that corresponds to the physical address to one of a plurality of data channels of a flash interface module.

6. The storage device of claim 1, wherein the controller is configured to:
- detect a number of non-volatile memory packages within the plurality of non-volatile memory packages during an initialization phase; and
- generate one or more dynamic threads based on the detected number of non-volatile memory packages, wherein each of the one or more dynamic threads corresponds to a different non-volatile memory package.

7. The storage device of claim 6, wherein the controller is configured to:
- perform an initialization configuration with each of the detected number of non-volatile memory packages during the initialization phase;
- determine a total capacity of the detected number of non-volatile memory packages based on the initialization configuration; and
- send a report indicating the determined total capacity to a host device.

8. The storage device of claim 1, wherein the controller is configured to:
- transition from a first non-volatile memory package of the plurality of non-volatile memory packages to a second non-volatile memory package of the plurality of non-volatile memory packages via the switch;
- flush one or more first flash translation layer control tables associated with the first non-volatile memory package from a volatile memory in response to the transition; and
- load one or more second flash translation layer control tables associated with the second non-volatile memory package to the volatile memory for data access.

9. The storage device of claim 8, wherein the controller is configured to:
- select the first non-volatile memory package with the switch during an initialization phase; and
- select the second non-volatile memory package with the switch during a runtime phase.

10. The storage device of claim 9, wherein the controller is configured to perform the boot-up process with the first non-volatile memory package during the initialization phase and perform the one or more storage device operations with the second non-volatile memory package during the runtime phase.

11. The storage device of claim 1, wherein the controller is further configured to perform the one or more storage device operations with the plurality of non-volatile memory dies in parallel within the selected first non-volatile memory package.

12. The storage device of claim 1, further comprising:
a flash interface module communicably coupled between the controller and the switch, wherein the plurality of non-volatile memory packages are connected to a same data channel for each of a plurality of data channels of the flash interface module via the switch,
wherein the plurality of non-volatile memory packages are connected to a same data channel for each of a plurality of data channels of the flash interface module via the switch.

13. A storage device, comprising:
a flash interface module;
a switch coupled to the flash interface module;
a memory comprising a plurality of non-volatile memory packages coupled to the switch, wherein each of the plurality of non-volatile memory packages comprises a plurality of non-volatile memory dies, wherein the plurality of non-volatile memory packages are connected to a same data channel for each of a plurality of data channels of the flash interface module via the switch; and
a controller configured to:
- select a first non-volatile memory package of the plurality of non-volatile memory packages associated with a first generation of memory with the switch,
- perform a boot-up process associated with the first generation of memory using the first non-volatile memory package,
- establish a data channel connection between the selected first non-volatile memory package and the controller via the switch, wherein the selected first non-volatile memory package is transitioned into an active mode and one or more non-selected non-volatile memory packages in the plurality of non-volatile memory packages are each transitioned into a standby mode,
- select a second non-volatile memory package of the plurality of non-volatile memory packages associated with a second generation of memory with the switch using the boot-up process associated with the first generation of memory, the first generation of memory and the second generation of memory corresponding to heterogeneous generations of memory that are different in terms of performance, and
- perform one or more storage device operations with one or more non-volatile memory dies of the plurality of non-volatile memory dies within the selected second non-volatile memory package,
wherein the flash interface module is communicably coupled between the controller and the switch.

14. The storage device of claim 13, wherein the controller is configured to:
- transition from a first non-volatile memory package of the plurality of non-volatile memory packages to a second non-volatile memory package of the plurality of non-volatile memory packages via the switch;
- flush one or more first flash translation layer control tables associated with the first non-volatile memory package from a volatile memory in response to the transition; and
- load one or more second flash translation layer control tables associated with the second non-volatile memory package to the volatile memory for data access.

15. The storage device of claim 14, wherein the controller is configured to:
- select the first non-volatile memory package with the switch during an initialization phase; and
- select the second non-volatile memory package with the switch during a runtime phase.

16. The storage device of claim 15, wherein the controller is configured to perform the boot-up process with the first non-volatile memory package during the initialization phase and perform the one or more storage device operations with the second non-volatile memory package during the runtime phase.

17. A storage device, comprising:
a flash interface module;
a switch coupled to the flash interface module;
a memory comprising a plurality of non-volatile memory packages coupled to the switch, wherein each of the plurality of non-volatile memory packages comprises a plurality of non-volatile memory dies; and
a controller configured to:
translate a logical block address from a host device to a physical address on the storage device with one or more flash translation layer control tables,
send a command signal to the switch that causes the switch to select a first non-volatile memory package of the plurality of non-volatile memory packages associated with a first generation of memory, the first non-volatile memory package corresponding to the physical address by locking the first non-volatile memory package to one of a plurality of data channels of the flash interface module,
perform a boot-up process associated with the first generation of memory using the first non-volatile memory package,
establish a data channel connection between the selected first non-volatile memory package and the controller via the switch, wherein the selected first non-volatile memory package is transitioned into an active mode and one or more non-selected non-volatile memory packages in the plurality of non-volatile memory packages are each transitioned into a standby mode,
send another command signal to the switch that causes the switch to select a second non-volatile memory package of the plurality of non-volatile memory packages associated with a second generation of memory with the switch using the boot-up process associated with the first generation of memory, the first generation of memory and the second generation of memory corresponding to heterogeneous generations of memory that are different in terms of performance, and
perform one or more storage device operations with one or more non-volatile memory dies of the plurality of non-volatile memory dies within the selected second non-volatile memory package,
wherein the flash interface module communicably is coupled between the controller and the switch, wherein the plurality of non-volatile memory packages are connected to a same data channel for each of the plurality of data channels of the flash interface module via the switch.

18. The storage device of claim 17, wherein the controller is configured to:
transition from a first non-volatile memory package of the plurality of non-volatile memory packages to a second non-volatile memory package of the plurality of non-volatile memory packages via the switch;
flush one or more first flash translation layer control tables associated with the first non-volatile memory package from a volatile memory in response to the transition; and
load one or more second flash translation layer control tables associated with the second non-volatile memory package to the volatile memory for data access.

19. The storage device of claim 18, wherein the controller is configured to:
select the first non-volatile memory package with the switch during an initialization phase; and
select the second non-volatile memory package with the switch during a runtime phase.

20. The storage device of claim 19, wherein the controller is configured to perform the boot-up process with the first non-volatile memory package during the initialization phase and perform the one or more storage device operations with the plurality of non-volatile memory dies in parallel within the second non-volatile memory package during the runtime phase.

* * * * *